United States Patent
Schill, Jr. et al.

(10) Patent No.: US 7,482,814 B2
(45) Date of Patent: Jan. 27, 2009

(54) ELECTRIC/MAGNETIC FIELD SENSOR

(75) Inventors: Robert A. Schill, Jr., Henderson, NV (US); Marc Popek, Las Vegas, NV (US)

(73) Assignee: The Board of Regents University Community College System of Nevada on Behalf of the University of Nevada-Las Vegas, Las Vegas, NV (US)

( * ) Notice: Subject to any disclaimer, the term of this patent is extended or adjusted under 35 U.S.C. 154(b) by 354 days.

(21) Appl. No.: 11/213,628

(22) Filed: Aug. 26, 2005

(65) Prior Publication Data
US 2006/0066304 A1    Mar. 30, 2006

Related U.S. Application Data

(60) Provisional application No. 60/605,069, filed on Aug. 27, 2004.

(51) Int. Cl.
    *G01R 29/12*     (2006.01)
    *G01R 33/00*     (2006.01)
    *G01R 27/04*     (2006.01)

(52) U.S. Cl. .................. 324/457; 324/260; 324/632

(58) Field of Classification Search ............. 324/457, 324/632, 260
See application file for complete search history.

(56) References Cited

U.S. PATENT DOCUMENTS

| | | | | |
|---|---|---|---|---|
| 4,305,705 | A | 12/1981 | Velling et al. | 431/208 |
| 4,626,791 | A | 12/1986 | Meldner et al. | 327/13 |
| 4,647,849 | A | 3/1987 | Strickland et al. | 324/95 |
| 4,775,837 | A * | 10/1988 | Roschmann | 324/322 |
| 6,424,927 | B1 * | 7/2002 | Sechi et al. | 702/126 |
| 6,456,070 | B1 * | 9/2002 | Kazama et al. | 324/95 |
| 6,919,845 | B2 * | 7/2005 | Ozaki et al. | 324/95 |
| 6,975,111 | B2 * | 12/2005 | Kazama et al. | 324/632 |
| 7,098,677 | B2 * | 8/2006 | Kazama et al. | 324/632 |

FOREIGN PATENT DOCUMENTS

EP    1316806 A1 * 6/2003

* cited by examiner

*Primary Examiner*—Timothy J Dole
(74) *Attorney, Agent, or Firm*—Mark A. Litman & Associates, P.A.

(57) ABSTRACT

A UNLV novel electric/magnetic dot sensor includes a loop of conductor having two ends to the loop, a first end and a second end; the first end of the conductor seamlessly secured to a first conductor within a first sheath; the second end of the conductor seamlessly secured to a second conductor within a second sheath; and the first sheath and the second sheath positioned adjacent each other. The UNLV novel sensor can be made by removing outer layers in a segment of coaxial cable, leaving a continuous link of essentially uncovered conductor between two coaxial cable legs.

21 Claims, 7 Drawing Sheets

US 7,482,814 B2

ELECTRIC/MAGNETIC FIELD SENSOR

RELATED APPLICATION DATA

This application claims priority from U.S. Provisional Application No. 60/605,069, filed Aug. 27, 2004

STATEMENT REGARDING FEDERALLY SPONSORED RESEARCH OR DEVELOPMENT

The U.S. Government has a paid-up license in this invention and may have the right in limited circumstances to require the patent owner to license others on reasonable terms as provided for by the terms of DE-FG02-00ER45831 awarded by the Department of Energy.

BACKGROUND OF THE INVENTION

1. Field of the Invention

The embodiments of the present invention relate to sensors for measuring magnetic field and electric field phenomena at the same time at the same point in space.

2. Background of the Art

Conventional small magnetic field sensors (commonly referred to as B-dots) consist of a coaxial cable with a coil located at the cable end. The center wire of the coaxial cable extends beyond the outer shield and is shaped in the form of a coil. Typically, the coil may be a single half loop, an integer number of loop turns, or an integer number of half loop turns. The coil end is then typically soldered to the outer shield. A conventional differential B-dot makes use of two nearly identical coils spaced closely together in a nearly unique orientation. For packaging purposes, the differential B-dot is housed within a conductive block filled with a dielectric substance. This packaging is not necessary in the differential B-dot design except when trying to eliminate or control proximity effects. Interconnection is made with two individual pieces of transmission line (coaxial cables). The B-dot is used to measure the rate of change of the magnetic fields in the location of the loop. According to Faraday's law, as the magnetic field lines threaded through the B-dot loop changes with respect to time, a voltage is induced in the coil that in turn drives a coil current. In an approximate sense, the induced voltage is proportional to the number of loops, the area of the loop, the magnetic field strength and either the inverse of time duration of the change or the time harmonic frequency of the signal.

More specifically, the voltage induced in a coil is proportional to the frequency of the event, the total-cross section of the coil and the number of turns. Thus, to obtain reliable sensitivity at lower frequencies, it is necessary to increase the cross-section and/or the number of turns. On the other hand, to widen the response to high frequencies, it is necessary for the coil to have low stray capacitances (capacitance between the coil and external entities) and low internal capacitances (capacitance between coil turns). Consequently, a reduced number of turns is desired and the dimensions of the sensor should be small compared with the wavelength corresponding to the highest frequency of interest. Therefore, it is difficult to fabricate a sensor having a wide pass band and with reliable sensitivity throughout the pass band.

A shielded flat coil is also known in the art. The shield is not continuous thereby avoiding a short-circuit loop which would generate a current in response to changes in the external magnetic field. This current would just counter the effects of the external field that the internal sensor would not detect the external field. A flat coil sensor can be optimized either for reliable sensitivity at low frequencies with a large diameter and a large number of turns, or for a response at high frequencies with a small diameter and a small number of turns. Unfortunately, the first optimization leads to a poor response at high frequencies while the latter optimization leads to a limitation of the sensitivity at low frequencies. Capacitive coupling from shield to shield across the gap exposing the sensor offers limitations to the sensitivity of this device.

The differential B-dot probes currently used to measure B field and exclude the E field are three-dimensional loops. This probe is a matched series parallel combination of loops which match a 50 ohm input of a tuned receiver or a power meter. This type probe must be constructed utilizing double sided flexible printed circuit board with low loss dielectric. This material is necessary to implement the complex stripline matching networks. In addition, the assembly of these loops are extremely difficult, time consuming, and the probes are difficult to maintain. The required power meters and receivers utilized to measure the output of these type loop probes are very expensive and hard to use for remote field measurements.

Two dimensional double gap detected probes are used to measure B fields in large test volumes which are remote from electrical power. Due to the large number of measurement points required to map test volumes and remoteness of some areas of interest, the probes need to be portable. In addition, the probe must be small and non-perturbing to the field being measured. The probe described in this disclosure is small, portable, and designed for minimum field perturbation. The output of the probe is read by an ordinary high impedance volt meter, which is inexpensive, small, easily portable, and does not require external power. These B-dot sensors may operate by oscillating a B-field in the loop area to induce a voltage in the conducting loop given by the relationship $V = A\, dB/dt$, where V is the voltage output of the loop, A is the area of the loop and dB/dt is the derivative of the time varying B-field. This voltage may be DC shifted by the high frequency voltage doublers and filtered by low pass filters, as described in U.S. Pat. No. 4,647,849. The DC outputs of the low pass filters are summed together by semiconductor line and brought out of the field by semiconductor lines to a voltmeter having a capacitor across it. The semiconductor lines are used to minimize the field pick-up in the transmission lines as well as minimize field perturbations.

U.S. Pat. No. 4,626,791 ("the '791 patent") discusses B-dots and their applications. More specifically, the '791 patent recites that a B-dot sensor may act as a microwave detector. In such an embodiment, the sensor comprises a conducting metal loop placed in a microwave signal environment such that magnetic flux passing through the loop changes over time and induces an electrical signal which is then recorded. The '791 patent specifically mentions the inherent limitations of B-dot loops (column 1-2, lines 50-68, 1-9; column 4, lines 46-57). That is, they are designed to only respond to the magnetic flux. However, as set forth above, the magnetic flux is often accompanied by a voltage distribution within close proximity of the loop. The spurious signals interfere with the measurement process. The '791 patent suggests the use of a second B-dot loop oriented in the opposite direction from the first B-dot loop to eliminate the impact of the noise. According to the present inventors, the second B-dot loop will have the same amplitude and 180° phase difference. Therefore, the electric field terms reduce to zero and the magnetic signal is increased by a factor of two. In principle this is reasonable but in practice, for exact cancellation one requires (this assumes that the coil end is terminated on the grounding shield): 1. Identical probes, 2. Identical relative ground line geometry that includes line lengths, bends and twists in the line, line cross-sectional dimensions, line orientations, 3. Line and coil locations must be in close proximity (typically 1/40 of the smallest wavelength associated to the highest frequency in the band pass, 4. Coils must have exact relative 180° orientation, 5. Coils and lines must be immersed in identical mediums and have identical proximity to external structures and 6. Coil axis must be aligned. Deviations from these exactness result in spurious noise signals that may effect the overall measurement especially as the frequency is increase.

U.S. Pat. No. 4,305,705 describes a sensor to provide information about flux changes in a coil that encloses a region of changing magnetic flux is formed by placing a pair of bifilar windings in the plane of the coil for which flux change is to be sensed. The winding may be inside or outside the coil. The bifilar winding is placed along that coil, one end of the bifilar winding is terminated in a short circuit and each winding is brought out to voltage-measuring equipment at the other end. The bifilar winding limits the response to the flux produced by the coil near which it is disposed and discriminates against changes in magnetic flux enclosed within the inner diameter of the coil. Pairs of bifilar windings may be used to compare differences of voltages, and the windings may be limited to part of the circumference of the coil to make local readiness. This patent describes a B-dot coil in FIGS. 2 and 3 as a top view and a sectional side view of an EF (equilibrium field) coil 18 of FIG. 1. FIG. 3 is a sectional view along section lines 3—3 of FIG. 2. FIGS. 2 and 3 of this patent also show a sensor 20 that is placed next to and inside EF coil 18 and a second sensor 22 placed next to and outside EF coil 18. Coils such as sensors 20 and 22 are frequently referred to as "B-dot" coils to indicate that they respond to the time derivative of the magnetic flux density B.

SUMMARY OF THE INVENTION

A dot sensor comprises: at least one single half loop, a single whole loop, multiple whole loops or multiple half loops of conductor seamlessly connected to central conductor materials in two coaxial cables. The dot sensor may have the loops are covered or uncovered with a dielectric material. The dot sensor may have the least one loop (or half loop) as a continuation of the two coaxial cables.

Accordingly, one embodiment of the present invention comprises the utilization of a single loop or multiple loops of wire with or without a uniform dielectric coating seamlessly attached to two identical coaxial transmission lines of same length. Near and at the coil end, the outer shield of the two coaxial lines are grounded together typically with solder. Because the shield is not electrically connected to the loop wire, signals pick-up by the shield are minimally coupled into the coaxial line. Consequently, the structure is substantially symmetric, thereby increasing the effectiveness of differential signal processing to extract the desired signal. The resultant symmetry provides a near perfect balance of the coil and interconnection structure. Accordingly, the symmetry allows one signal to be subtracted resulting in a zero for common mode electric field stimulus. The symmetry also provides a maximum signal for suitably oriented magnetic field energy. Moreover, adding the signals (instead of subtracting the signals) removes the magnetic field stimulus from the combined signal signature leaving the electric field signal as the measurable. Consequently, the reduction and control of the induction and capacitance expands the useful wide bandwidth in the frequency domain.

DETAILED DESCRIPTION

Figure 1A:
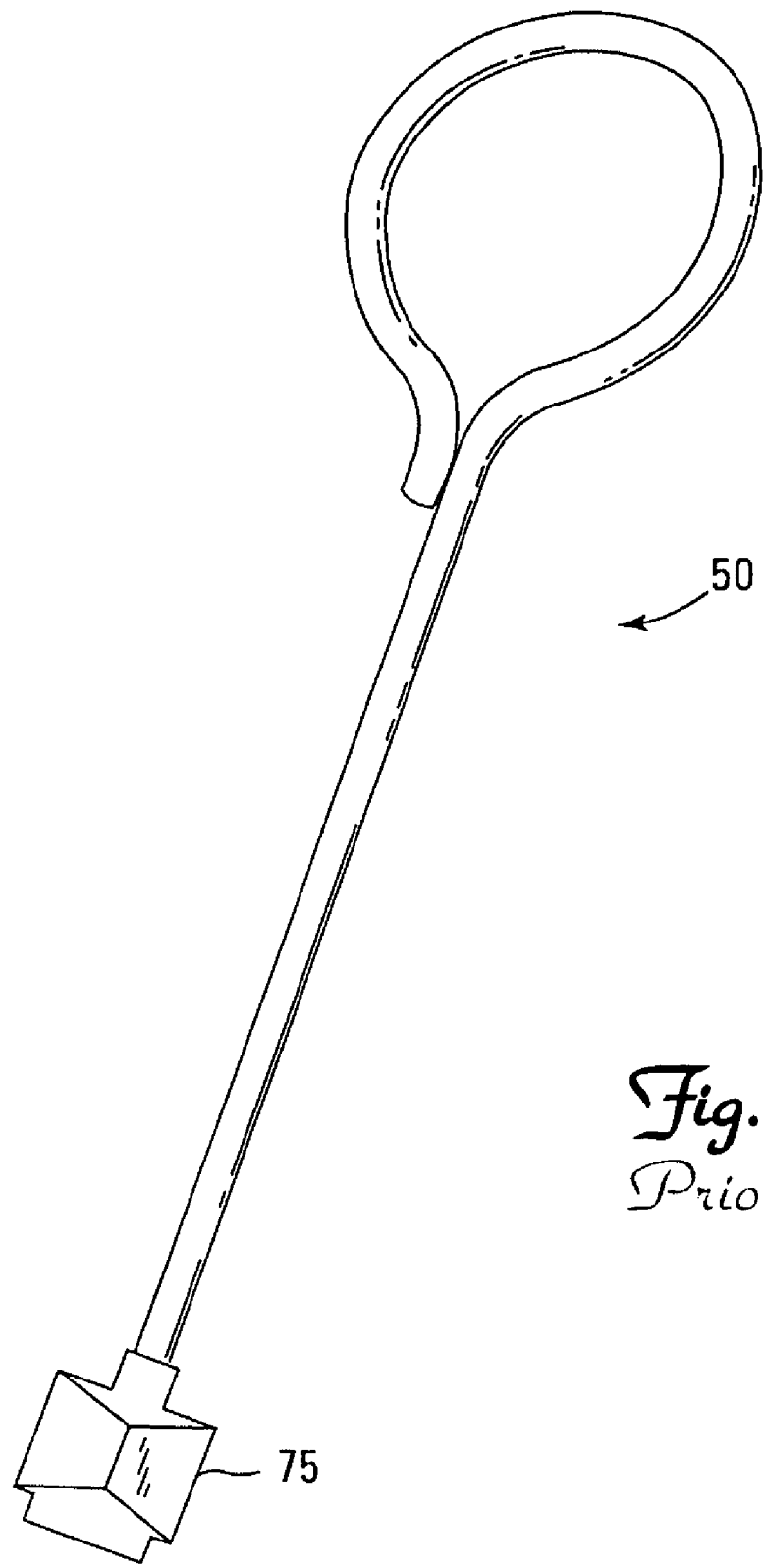
FIG. 1A illustrates a magnetic field sensor of the prior art.

A conventional differential B-dot makes use of two nearly identical coils spaced closely together in a nearly unique orientation. For packaging purposes, the differential B-dot is housed within a conductive block filled with a dielectric substance. This packaging is not necessary in the differential B-dot design except when trying to eliminate or control proximity effects. Interconnection is accomplished using two pieces of transmission line one for each dot in the differential B-dot set. However, under close scrutiny, the standard and differential B-dot reveals critical limitations. The standard B-Dot suffers from symmetry and ground loop issues. For the differential B-dot to exhibit a spurious noiseless signal, one requires (this assumes that the coil end is terminated on the grounding shield): 1. Identical probes, 2. Identical relative ground line geometry that includes line lengths, bends and twists in the line, line cross-sectional dimensions, line orientations, 3. Line and coil locations must be in close proximity (typically 1/40 of the smallest wavelength associated to the highest frequency in the band pass), 4. Coils must have exact relative 180° orientation, 5. Coils and lines must be immersed in identical mediums and have identical proximity to external structures and 6. Coil axis must be aligned. Deviations from these exactness results in spurious noise signals that may effect the overall measurement especially as the frequency is increase. The embodiments of the present invention overcome the shortcomings of the prior art. The present invention will be identified as the UNLV novel dot, novel dot or UNLV dot below since the invention measure both the electric and magnetic field components at the same time at the same location in space with a single probe.

In conventional terminology, B means magnetic flux density and D implies electric flux density. The term "dot" has two implications. First, dot implies small. Typically, B-Dots and D-Dots as well as UNLV's novel dot measures the field at a localized position in space. Second, the dots (B, D, and UNLV's) actually do not measure the fields. What is measured is the change in the field with respect to time. The fields are obtained by integrating the signals with respect to time.

So, more correctly, the dots measure the rate of change of the field with respect to time. By appropriately adding and subtracting the output signals the UNLV dot will provide information on the change in electric and the change in the magnetic fields both with respect to time. After processing the signals, one may recover the actual fields within the bandwidth limitations of the device.

Conventional B-Dots and D-Dots find application in the Pulsed Power Industry. In the United States, the pulsed power community is small and the pulsed power industry is driven mainly by the Department of Energy and the Department of Defense. Internationally, the pulsed power industry finds applications in the environment, biological/medical and material fields. Conventional Dots also can be characterized as:

a. Outer shield acting as a signal pick-up so dot is not shielded.
 b. Soldering is required to attach the shielded central wire of the coaxial cable of the conventional to the outer shield. Refer to FIG. 1b.
 c. Not symmetric, which may affect the interpretation of the signals measured.
 d. May require two dots to make a suitable measurement (B-Dot arrangement) hence size, shape, location, and orientation affects the meaning of the data measured.
 e. Measures either the change in magnetic field or the change in electric field, not both.
 f. May be considered as being matched since probe is manufactured from conventional coaxial cables.
 g. There is a question as to Bandwidth limitations on each separate design. The bandwidth acceptability is both design and designer dependent.

The novel technology for UNLV novel dots described herein has been shown to be capable of providing characteristics such as being:

h. May be considered as being matched since conventional coaxial cable is used in the design of the sensor
 i. Provides a relatively wide bandwidth.
 j. The system is capable of making two measurements at one point in time at one point in space (depending on the set-up: time varying magnetic field and a time-varying electric field OR a time-varying surface current density and a time-varying voltage).
 k. The Single B-Dot according to the presently described technology can perform as a differential B-Dot and as a D-Dot.
 l. Although functioning as a D-dot, D-dot measurement may be device specific and may require some calculation or calibration in the system where measurements are being made.
 m. The system is naturally a Shielded dot.
 n. There is no need for solder connections.
 o. The system has Symmetry.
 p. The novel B-dot allows for measuring signal transitions from open circuit to short circuit to be examined with highest accuracy at each instant in time at a particular location
 q. The simplicity of the design allows the UNLV novel dot to be reasonably reproducible.

Figure 1B:
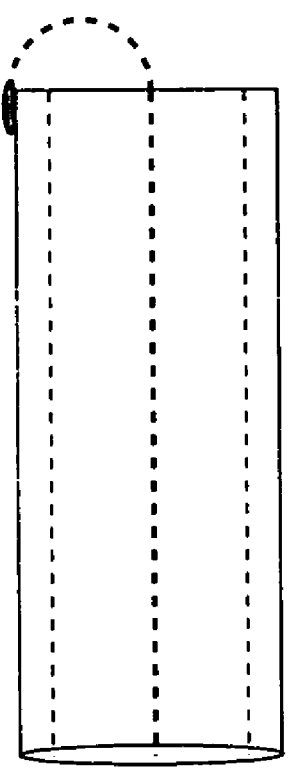
FIG. 1B illustrates commonly used magnetic sensors in industry and research (Note: Multiple loops are typical, only half loop shown)

In the commercial industry, B-Dots have close similarity to loop antennas (Refer to FIG. 1a). It is well known that loop antennas, especially small loop antennas (dots), are inefficient radiators (transmitters). Small loop antennas find applications as good sensors.

Conventional B-dots have the inner wire of a conventional coaxial cable soldered to the outside shielding (A coaxial cable is basically a cylindrical tube with a wire on tube axis. The region between the outside radius of the solid wire on axis and the inside radius of the outer tube is filled with an insulator [dielectric].). Refer to FIG. 1b. By an electrostatic effect, a displacement current effect and/or a Faraday effect, a signal can be induced on the outer shield of the wire which in turn is fed to the center wire on top of the signal to be measured. These are usually undesired effects. In practice, engineers and scientists use two "identical" dots with the "opposite" orientation at "nearly the same region" in space to pick-up hopefully the same signals. If this can be performed accurately, then the difference between the signals picked-up yields the raw data for the time varying magnetic field at the coil end. At a high frequency, say greater than 3 GHz, the distance between the two dots must be no larger than 2.5 mm in order to say that the two dots are "feeling" the same signals at the same time. (Computation was obtained by assuming the dot is in free space and $1/40$ of the wavelength is a small enough engineering approximation for both dots to see about the same phase of the wave.) When two B-dots are used in a set to measure the change in the magnetic field while minimizing the so called "capacitive coupling effects" which we will denote at the noise or undesired signal effects, the sensor is labeled as a Differential B-Dot. Conventional B-dots also have a non-symmetric geometry about dot center. In the commercial industry, one would have to use two dots in order to perform a single function in measuring the magnetic field or, if appropriate, the surface current. It would be hard to develop a probe with this capability especially since one wants small compact geometries to reach hard to get at localized points in a system (e.g., an electronic circuit board with many components).

The geometry of the presently described Dot is very simple. In essence, it is a coaxial cable that is commercially found on the market already designed with conventionally accepted characteristic impedance. The characteristic impedance may be considered as being the loading effect of the medium to transport energy from one point in space to a second point in space without reflection along the line or if you like along the cable. For example, free space has a 377 Ohms load to an antenna. In most cases, the loading effect of the line to propagating waves is 50 Ohms. The coaxial cable is composed of concentrically oriented, solid, cylindrical conductive wire with a cylindrical grounding jacket (tube). The grounding jacket may be a solid copper tube or interlaced stranded wires forming a cylindrical tube. Because it is a readily available material and design, it has been used as the solid copper tube geometry in most studies. Sandwiched in between the (preferably copper) conductors is a dielectric (good electrical insulator). The geometry and materials employed in the design of the coaxial cable provides the loading effect of the cable to propagating waves (characteristic impedance).

In essence the novel dot is formed from a single coaxial cable transmission line that is commercially found on the market already designed with conventionally accepted characteristic impedance. The coaxial cable is composed of concentrically oriented, solid, cylindrical wire with a cylindrical grounding jacket (tube). The grounding jacket may be a solid copper tube or interlaced stranded wires forming a cylindrical tube. Sandwiched in between the copper conductors is a dielectric (good electrical insulator). The geometry and materials employed in the design of the coaxial cable provides the loading effect of the cable to propagating waves (characteristic impedance). In the design of the UNLV Dot, the coaxial cable shield (the outer coaxial tube) of a predetermined length of coaxial line is carefully cut without significantly cutting into the dielectric material. A lathe or any pulling apparatus may be used to pull on the ends of the cable piece. With proper pressure on the ends, the outer jacket will slide along the dielectric. Heat applied to the outer jacket may help the outer jacket slide along the dielectric surface. Care must be taken not overheat the cable piece. Once a predetermined length of dielectric is exposed, the central portion of the coaxial piece is formed into a single half loop or an integer number of loops or an integer number of loops plus a half loop so that there is a high degree of symmetry when rotating the dot about the cable ends 180 degrees. The copper jackets (copper shield) are not part of the loop. The edges and length of the copper jackets are brought together and soldered from the edge back a short distance. The ends of the coaxial cable are then appropriately cut and prepared for suitable connector (SMA, BNC, or etc. depending on the bandwidth) crimping. The dot has now been designed. The dielectric shielding may be stripped from the wire loop using heat and chemical solvents.

The dot is then calibrated with a UNLV dot test stand over a wide frequency range in the frequency domain. A thesis has been devoted to the study of this test stand and a paper has already been submitted for review for journal publication. The theory coupled with the test stand hardware is unique with reasonable agreement shown between theory and experiment.

Reference is now made to the figures wherein like parts are referred to by like numerals throughout. FIG. 1a illustrates a magnetic field sensor 50 and corresponding connector 75 found in the prior art. This sensor is normally considered as a loop antenna. FIG. 1b illustrates a commonly found B-dot commonly used in research.

Figure 2:
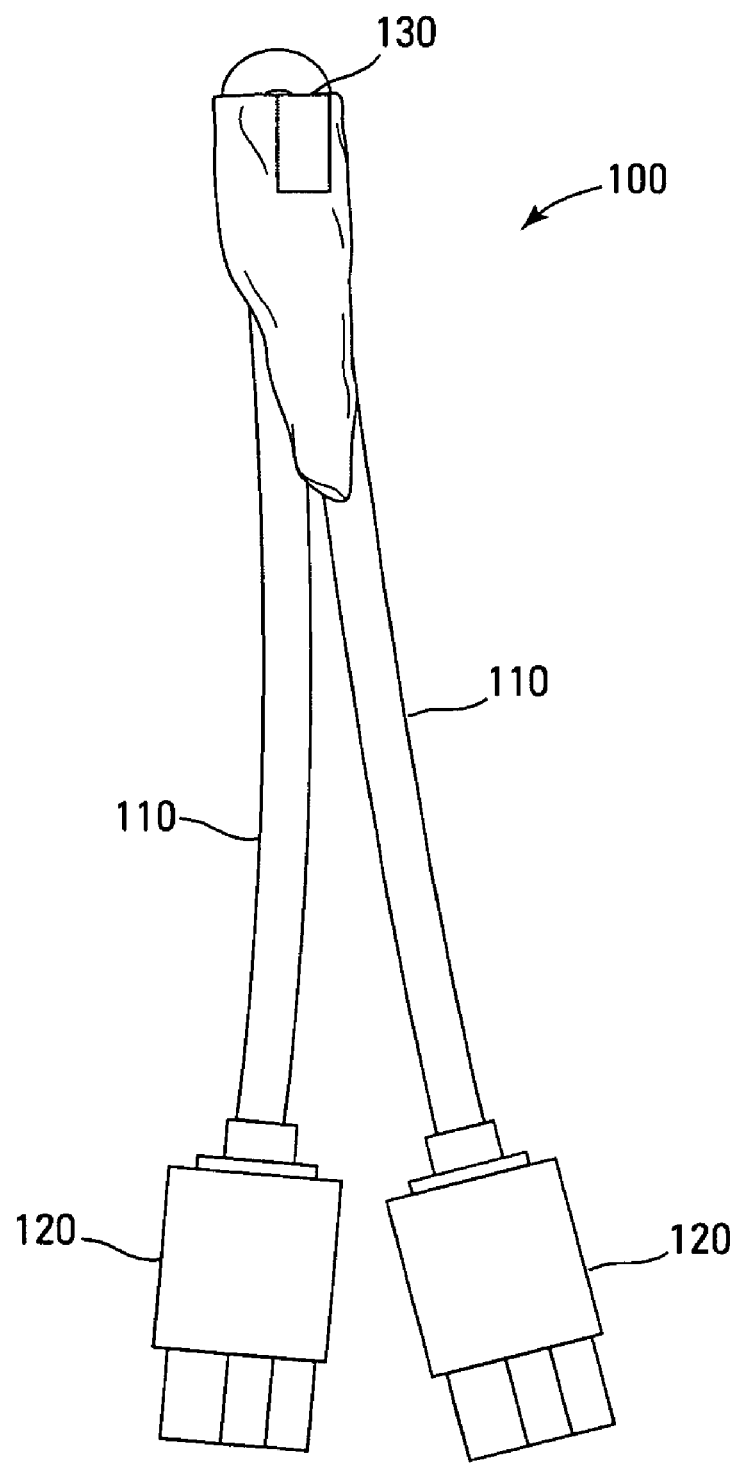
FIG. 2 illustrates one embodiment of a magnetic field sensor according to the present invention.

Now referring to FIG. 2, the UNLV novel sensor of the present invention is denoted by reference numeral 100. The sensor 100 includes two transmission lines 110 each having a connector 120 at a first end thereof. A second end of each line 110 supports one end of a loop of conductive material 130 for facilitating the measurement of magnetic and electrical fields. The connectors 120 permit the field sensor 100 to communicate with equipment or devices for recording, calculating and/or displays data received by the sensor 100.

In free space, the novel dot 100 acts as a dual magnetic flux and electric flux sensor. Thus, when the UNLV dot 100 is inserted into a cavity, it measures the magnetic flux at the point of insertion defined by the area (e.g., 1 $mm^2$) of the actual loop 130. In addition, when inserted in the plane of a guided structure's metallic boundaries, the surface current in the nearby conductive surface can be directly measured with the dot sensor 100.

The novel dot sensor 100 will have a broad impact in the commercial arena. The sensor 100 may be used as a physics tool or a non-contact field probe. As physics instrument, the sensor 100 provides insight into the detailed and accurate behavior of electric currents and their associated magnetic flux and can show real-time and fine time (e.g., 20 ps) behaviors. Thus, the UNLV dot sensor 100 is useful in situations involving high speed activities. Moreover, the small defined area and symmetry of the loop 130 provides a sensor for showing behaviors at small discrete points. In this manner, arrays of the novel dots can be strategically placed to detect the movement of energy over large structures. For example, energy can be sensed in time and space by utilizing multiple UNLV dot sensors 100 along drift regions of linear accelerators or similar structures.

As a non-contact field probe, the UNLV dot sensor 100 functions like a probe. That is, the user connects the UNLV dot sensor 100 to an oscilloscope, spectrum analyzer or any other instrument to sample the spatial and time fields being displayed by the instrument. Probes having ultra-wide bandwidth routinely sell for several thousand dollars. Moreover, the shear number of instruments being utilized provides an enticing market for the low cost sensor 100 of the present invention.

Furthermore, acting as a non-contact probe, the UNLV sensor 100 has applications in the semiconductor industry. Since semiconductors traditionally need to be wired bonded to an electric port to be excited and measured, the novel dot sensor 100 provides a means to measure without the necessity of wire bonding. Also, as a non-contact probe, the B-dot sensor 100 will be able to measure discrete points in a circuit.

Advantageously, the UNLV dot sensor 100 disclosed herein solves many shortcomings of the prior devices, acts as a both a B-dot and D-Dot and V-dot for measuring fast electric and magnetic fields simultaneously at one location, and is low cost.

Reference to FIGS. 3, 4A, 4B, 5 and 6 will assist in better appreciating the technology described herein.

Figure 3:
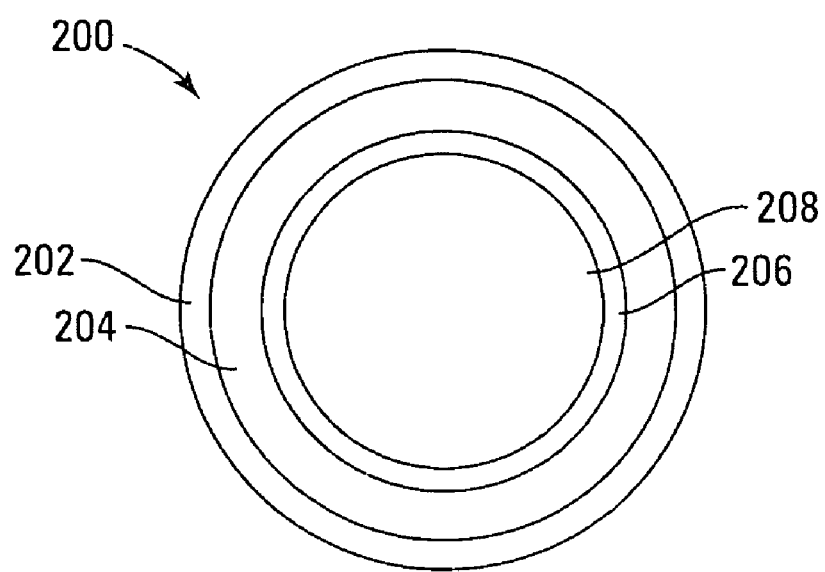
FIG. 3 shows an end view of a typical coaxial cable.

FIG. 3 shows a cross-section of a typical coaxial cable 200 comprising an insulating outer layer 202, the conductive layer 204, the intermediate dielectric layer 206 and the internal semiconductor layer 208.

Figure 4A:
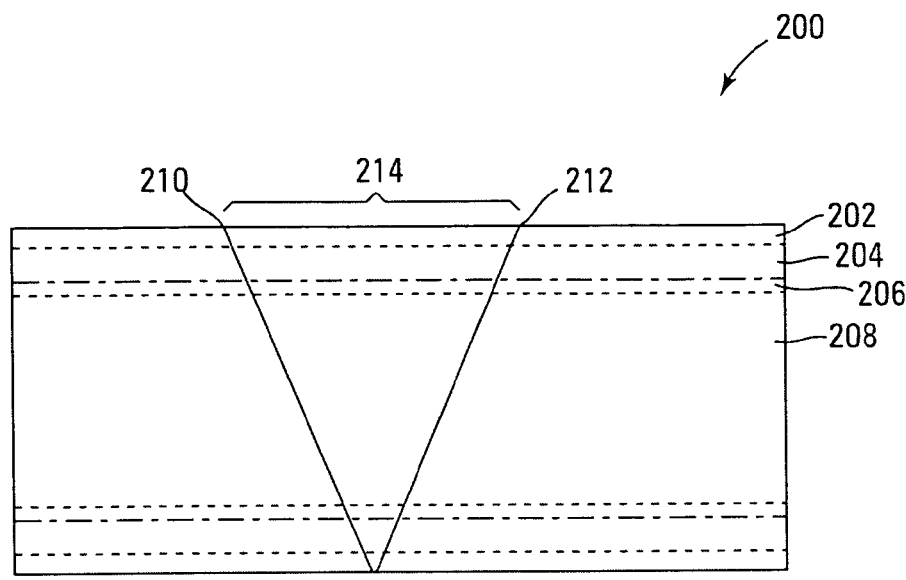
FIG. 4 shows a modified UNLV novel sensor having a pair of loops. In this example, the loops are joined at a central point of symmetry between the two loops. This patent also includes the same geometry without joining at the central point of symmetry between the two loops. Such a sensor is a directional sensor.

FIG. 4A shows a side view of a typical coaxial cable 200 comprising an insulating outer layer 202, the conductive layer 204, the intermediate dielectric layer 206 and the internal central conductor layer 208. Grooves 210 and 212 are shown cut into insulating layer 202 and through the conductive layer 204, with minimum damage to the dielectric layer 206, only to assure that the central conductor layer 208 is not cut or scored. A volume of the insulating layer 214 is to be removed.

Figure 4B:
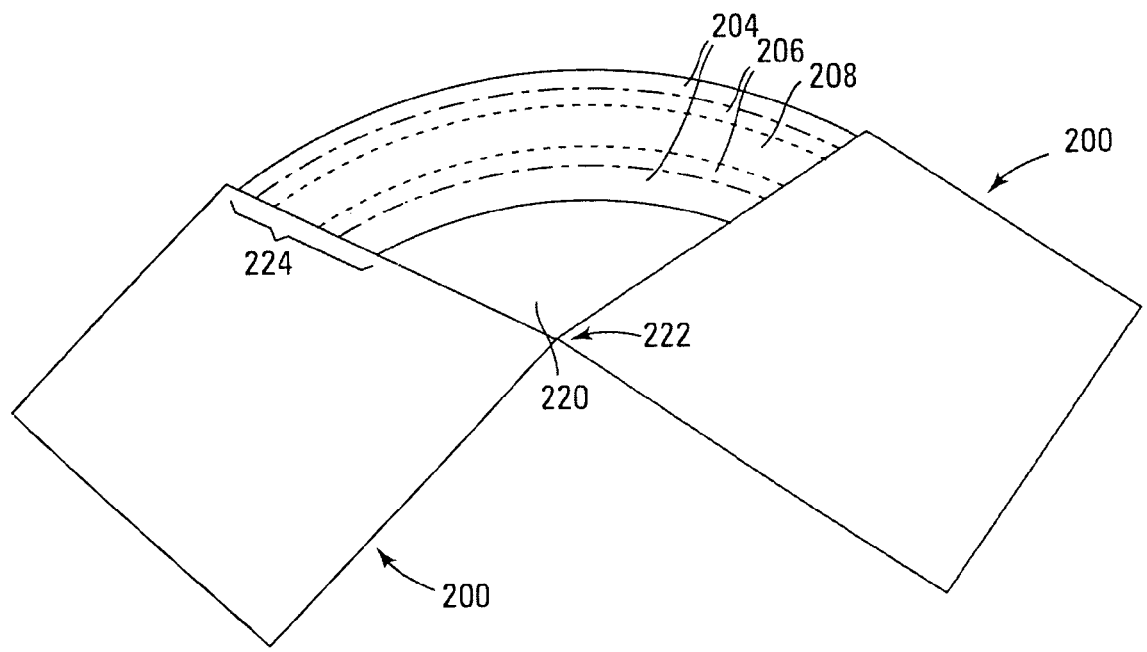

FIG. 4B shows where the volume of the insulating layer (not shown) has been removed and two legs of the coaxial cable 200 have been bent aside to further expose the inside of the coaxial cable 200 here with the conductor layer 204 shown for convenience (it is usually removed in this step), dielectric layer 206 and semiconductor layer 208. A gap 220 is shown above a hinged line 222 and below the remaining central part 224 of the coaxial cable 200.

Figure 5:
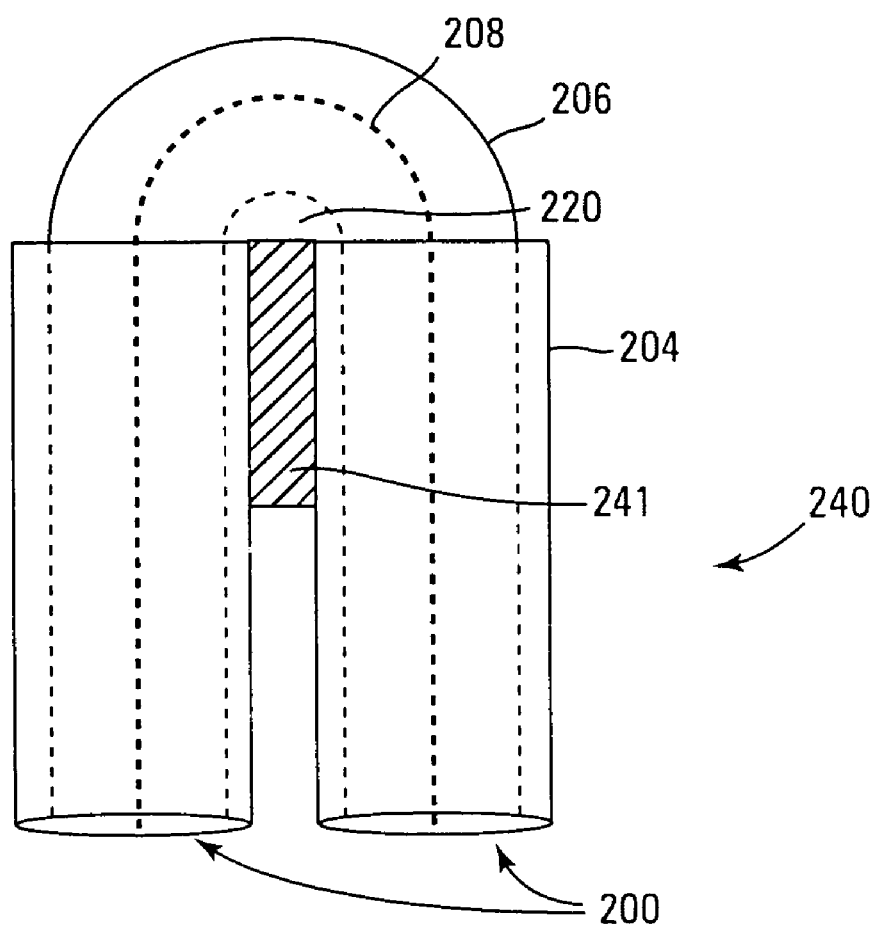
FIG. 5 shows a side view of the nearly formed B-dot construction of the present technology. (NOTE: Half loop design shown, but multiple loops are also covered in the disclosure).

FIG. 5 shows a side view of the nearly formed B-dot construction 240, after removal of the insulating layer and conductive layer, leaving only the dielectric layer 206 and the central conductor layer 208. The gap 220 is still shown above the remaining arms of the coaxial cable 200. An adhesive or solder patch 241 may be used to secure the two coaxial cables 200 together for physical stability of the loop.

Figure 6:
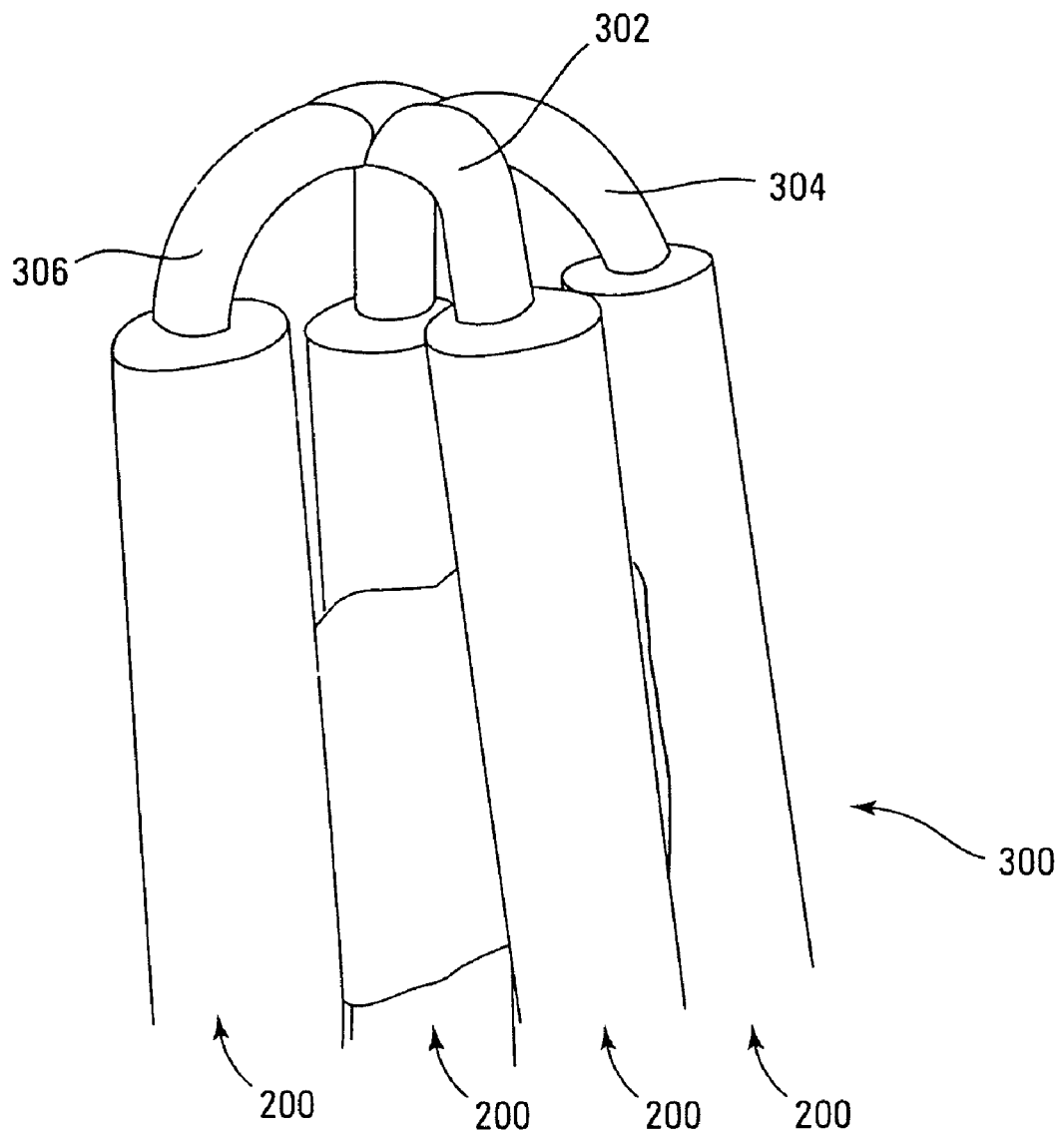
FIG. 6 shows a modified UNLV dot sensor having a pair of loops joined at a central point of symmetry

Please refer to FIG. 6 which shows a modified UNLV dot sensor 300 having a pair of loops joined at a central point of symmetry 302 between the two loops 304 and 306. The loops need not be joined electrically joined, but they may be so joined. The four arms of coaxial cable 200 are shown, with one pair supporting each of the loops 304 and 306. Other combinations of multiple loops (e.g., parallel loops, a helical loop with the coils of the helix being nearly uniformly distant from a common axis of the coil, and the like) may also be used.

It can be seen that the B-dot described herein can be simply manufactured from existing materials to provide a significantly advantageous component. As shown in the above description, no soldering was needed on the functional end of the UNLV novel dot, a symmetrical B-dot can be provided by rounding the loop of central wire of the coaxial cable, which can be accomplished by simple physical means such as a shaping center piece in the gap. It is possible to manufacture a similar B-dot by other means such as providing two cut ends of coaxial cable and securing a loop of semiconductor between the two exposed ends of semiconductor from the two cut ends of coaxial cable. The securing, however, is likely to be by sintering, fusing, or soldering, which complicates the process, makes it more expensive, and reduces some of the quality characteristics of performance from a symmetrical, unsoldered loop and arms.

Although the invention has been described in detail with reference to several embodiments, additional variations and modifications exist and the invention should not be limited to any specific embodiment disclosed herein.

What is claimed:

1. An electric/magnetic-dot sensor comprising:
   a loop of sensor conductor having two ends to the loop, a first end and a second end;
   the entire loop having a dielectric coating thereon;
   the first end of the sensor conductor comprising a continuous length of conductor extending as a first central conductor within a first conductive sheath;
   the second end of the sensor conductor comprising a continuous length of conductor extending as a second conductor within a second conductive sheath; and
   the first conductive sheath and the second conductive sheath positioned adjacent each other and a first end of the first conductive sheath and a first end of the second conductive sheath being grounded and physically secured together adjacent to the loop.

2. The electric/magnetic-dot sensor of claim 1 wherein the second end of the sensor conductor comprising a continuous length of conductor extending as a second central conductor within the second conductive sheath, the grounding together effected by sintering, fusing or soldering.

3. The electric/magnetic-dot sensor of claim 2 wherein the loop, the first end of the sensor conductor and the second end of the sensor conductor comprises of a single conductor that is free of sintering, fusing and soldering.

4. The electric/magnetic-dot sensor of claim 1 wherein the entire loop is continuous with both the first end and the second end of the sensor conductor, the sensor conductor within the first conductive sheath is a first coaxial cable and the sensor conductor within the second conductive sheath is a second coaxial cable which first coaxial cable and second coaxial cable consists of a single continuous elongated conductor comprising the sensor conductor.

5. The electric/magnetic dot sensor of claim 4 wherein the first conductive sheath comprises outer layers of a coaxial cable with the first central conductor being the center layer in the coaxial cable.

6. The electric/magnetic-dot sensor of claim 5 wherein the second conductive sheath comprises outer layers of a coaxial cable with the second conductor being the center layer in the coaxial cable.

7. The electric/magnetic-dot sensor of claim 6 wherein an end of each coaxial cable distal from the loop has an electrical connector thereon.

8. The electric/magnetic-dot sensor of claim 7 wherein the loop is circular.

9. The electric/magnetic-dot sensor of claim 6 wherein the loop is circular.

10. The electric/magnetic-dot sensor of claim 5 wherein an end of the coaxial cable distal from the loop has an electrical connector thereon.

11. The electric/magnetic-dot sensor of claim 6 wherein the loop is circular.

12. The electric/magnetic-dot sensor of claim 5 wherein at least two loops from two sets of sheaths intersect at an intermediate point and the two loops are secured.

13. The electric/magnetic-dot sensor of claim 12 wherein the at least two loops are mechanically secured to each other.

14. The electric/magnetic-dot sensor of claim 13 wherein the two loops are not electrically secured together.

15. The electric/magnetic-dot sensor of claim 5 wherein the loop is helical.

16. The electric/magnetic-dot sensor of claim 4 wherein the second conductive sheath comprises outer layers of a coaxial cable with the second conductor being the center layer in the coaxial cable.

17. The electric/magnetic-dot sensor of claim 1 wherein the loop is circular.

18. The electric/magnetic-dot sensor of claim 1 wherein the loop is helical.

19. A method of forming the electric/magnetic dot sensor of claim 1 comprising at least one single half loop, a single whole loop, multiple whole loops or multiple half loops of conductor seamlessly continuing as central conductor materials in two coaxial cables, the method comprising:
   providing a coaxial cable comprising in order from the center of the cable a central conductor layer, an adjacent dielectric layer, and a conductor layer;
   removing the conductor layer from a central portion of the coaxial cable;
   forming a loop of the central conductor material formed by removing the conductor layer while the central conductor remains attached to the central conductor layer in the coaxial cable on both sides of the loop formed from the center of the cable.

20. The method of claim 19 wherein the coaxial cable also has a dielectric layer, and the dielectric layer is not removed from the loop, leaving a dielectric covering over the loop.

21. The method of claim 20 wherein after removal of the conductor layer, the central conductor layer is extended from the coaxial cable to assist in forming a symmetrical loop of central conductor and wherein the conductive sheaths over the dielectric layer in the coaxial cable on both sides of the loop are grounded to each other adjacent to the loop.

* * * * *